US012657359B2

(12) United States Patent
Baek et al.

(10) Patent No.: US 12,657,359 B2
(45) Date of Patent: Jun. 16, 2026

(54) QUANTUM COMPUTING SYSTEM BASED ON QUANTUM DOT QUBITS AND OPERATION METHOD THEREOF

(71) Applicant: Electronics and Telecommunications Research Institute, Daejeon (KR)

(72) Inventors: Chungheon Baek, Daejeon (KR); Byung-Soo Choi, Daejeon (KR); Taewan Kim, Daejeon (KR); Yongsoo Hwang, Daejeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 954 days.

(21) Appl. No.: 17/903,146

(22) Filed: Sep. 6, 2022

(65) Prior Publication Data

US 2023/0097026 A1 Mar. 30, 2023

(30) Foreign Application Priority Data

Sep. 30, 2021 (KR) ........................ 10-2021-0130244
Aug. 9, 2022 (KR) ........................ 10-2022-0099401

(51) Int. Cl.
G06F 30/327 (2020.01)
G06N 10/40 (2022.01)
G06N 10/80 (2022.01)

(52) U.S. Cl.
CPC ........... G06F 30/327 (2020.01); G06N 10/40 (2022.01); G06N 10/80 (2022.01)

(58) Field of Classification Search
CPC ...... G06F 30/327; G06N 10/40; G06N 10/80; G06N 10/20
See application file for complete search history.

(56) References Cited

U.S. PATENT DOCUMENTS 7,453,162 B2 11/2008 Freedman et al.
8,671,369 B2 * 3/2014 Ahn ........................ B82Y 10/00
716/132

(Continued)

FOREIGN PATENT DOCUMENTS

KR 10-2020-0101333 A 8/2020

OTHER PUBLICATIONS

Korean Office Action on Jul. 3, 2025 in corresponding Korean Patent Application No. 10-2022-0099401 (7 pages in Korean).

(Continued)

*Primary Examiner* — Nha T Nguyen
(74) *Attorney, Agent, or Firm* — NSIP Law

(57) ABSTRACT

Disclosed is a quantum computing system including an input processing unit that performs a quantum dot qubit-based quantum computing operation based on a user input algorithm and input data including information for controlling an operation, and converts the user input algorithm into a gate-based transformation algorithm, an algorithm decomposition unit that generates an equivalent circuit corresponding to the transformation algorithm, a quantum circuit mapping unit that generates a modified equivalent circuit by rearranging qubits constituting the equivalent circuit, a driving signal generation unit that generates a driving signal for controlling the modified equivalent circuit, a computing execution unit that performs the quantum computing operation by applying the driving signal to the modified equivalent circuit and generates computing data, and an output unit that converts the computing data into logical data and outputs the logical data as result data.

16 Claims, 6 Drawing Sheets

(56) References Cited

U.S. PATENT DOCUMENTS

| | | | |
|---|---|---|---|
| 10,922,457 B2 | 2/2021 | Nam et al. | |
| 12,443,869 B2 * | 10/2025 | Griffin | G06N 10/40 |
| 2006/0123363 A1 * | 6/2006 | Williams | G06N 10/20 |
| | | | 977/839 |
| 2018/0013426 A1 | 1/2018 | Deurloo et al. | |
| 2019/0194016 A1 | 6/2019 | Roberts et al. | |
| 2019/0244128 A1 | 8/2019 | Choi et al. | |
| 2019/0332731 A1 | 10/2019 | Chen et al. | |
| 2019/0393398 A1 | 12/2019 | Leipold et al. | |
| 2020/0218842 A1 * | 7/2020 | Itoko | G06F 30/327 |
| 2020/0334563 A1 * | 10/2020 | Gambetta | B82Y 10/00 |
| 2020/0342344 A1 * | 10/2020 | Gambetta | G06N 20/00 |
| 2020/0364600 A1 | 11/2020 | Elsherbini et al. | |
| 2020/0412531 A1 | 12/2020 | Kim et al. | |
| 2021/0233957 A1 | 7/2021 | Tsai et al. | |
| 2022/0027323 A1 * | 1/2022 | Coady | G06N 10/00 |
| 2022/0284339 A1 * | 9/2022 | Wang | G06N 10/20 |
| 2024/0119329 A1 * | 4/2024 | Dou | G06N 10/70 |
| 2025/0298993 A1 * | 9/2025 | Lu | G06F 30/27 |

OTHER PUBLICATIONS

Korean Office Action Issued on Apr. 23, 2025, in Counterpart Korean Patent Application No. 10-2022-0099401 (8 Pages in English, 8 Pages in Korean).

Veldhorst, M., et al. "Silicon CMOS architecture for a spin-based quantum computer." *Nature communications* 8.1 (Dec. 15, 2017): 1-8.

* cited by examiner

Figure 4:
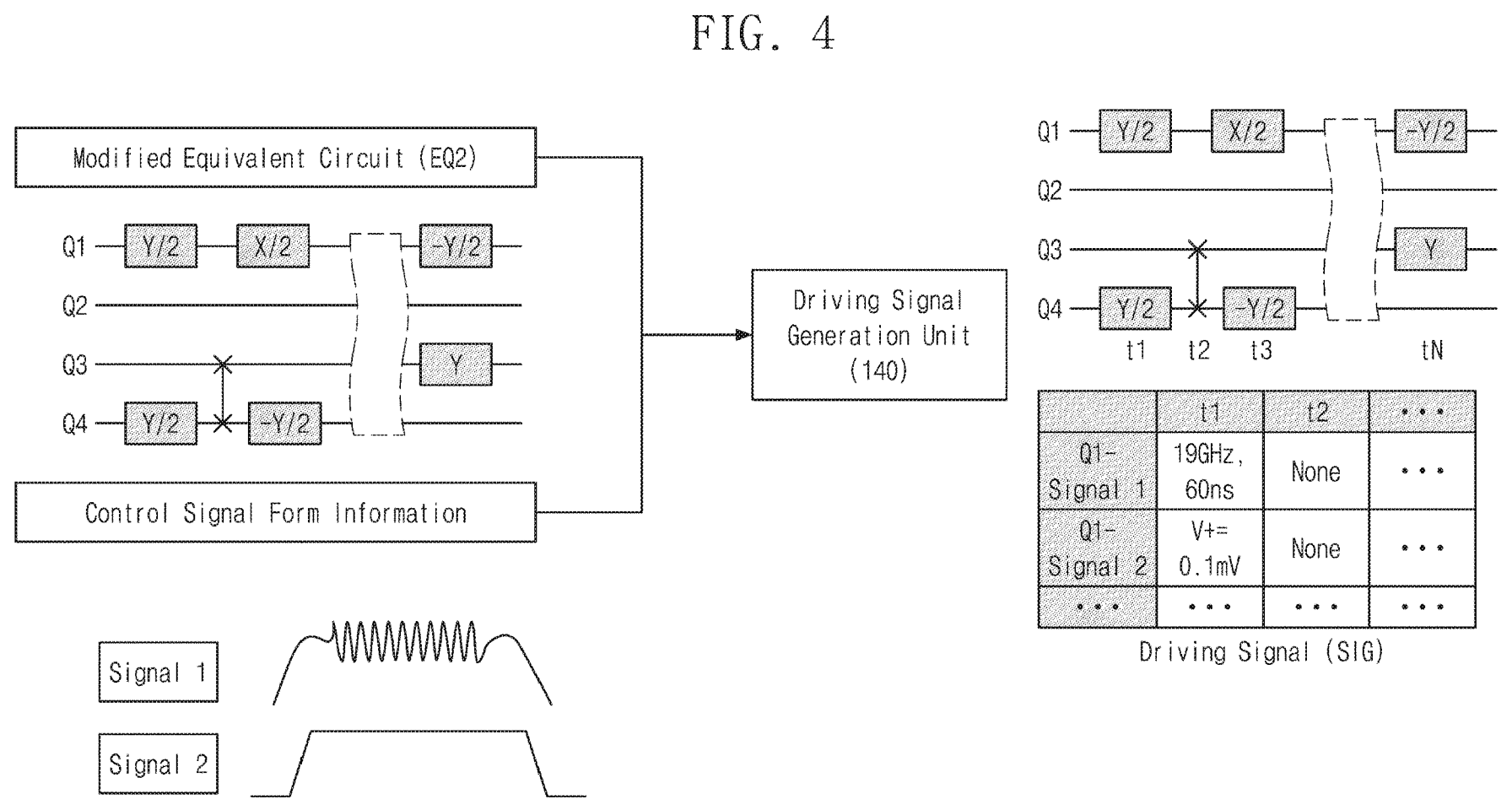

Modified Equivalent Circuit (EQ2)

Q1  Y/2  X/2  -Y/2
Q2
Q3
Q4  Y/2  -Y/2  Y

Control Signal Form Information

Signal 1

Signal 2

Driving Signal Generation Unit (140)

Q1  Y/2  X/2  -Y/2   t1
Q2
Q3           -Y/2
Q4  Y/2      Y        tN

| | t1 | t2 | | tN |
|---|---|---|---|---|
| Q1- Signal 1 | 19GHz, 60ns | None | ... | ... |
| Q1- Signal 2 | V+= 0.1mV | None | ... | ... |
| ... | ... | ... | ... | ... |

Driving Signal (SIG)

1

QUANTUM COMPUTING SYSTEM BASED ON QUANTUM DOT QUBITS AND OPERATION METHOD THEREOF

CROSS-REFERENCE TO RELATED APPLICATIONS

This application claims priority under 35 U.S.C. § 119 to Korean Patent Application No. 10-2021-0130244 filed on Sep. 30, 2021, and No. 10-2022-0099401 filed on Aug. 9, 2022, in the Korean Intellectual Property Office, the disclosures of which are incorporated by reference herein in their entireties.

BACKGROUND

Embodiments of the present disclosure described herein relate to quantum computing, and more particularly, relate to a quantum computing system based on quantum dot qubits, and an operating method thereof.

A general computer stores and processes information based on bits composed of 0 and 1. On the other hand, unlike a conventional computer, a quantum computer, which is being actively researched, processes information by using a superposition feature of a qubit capable of simultaneously processing or having 0 and 1.

To operate a quantum algorithm, various factors needs to be considered, such as the type of a quantum gate capable of being implemented with a target of a quantum dot qubit, whether an operation between qubits is possible, the placement of a qubit according to the accuracy of an operation, a configuration of a quantum gate signal, and the like. In general, the quantum algorithm has been implemented to target a small number of quantum dot qubits, and has been dependent on a user's knowledge, experience, or intuition. Accordingly, to improve the accuracy of quantum dot qubit-based quantum computing, there is a need to research the quantum computing capable of effectively implementing a quantum circuit based on a systematic execution sequence.

SUMMARY

Embodiments of the present disclosure provide a quantum dot qubit-based quantum computing system that may effectively implement a quantum circuit to improve the accuracy of quantum computing, and an operating method thereof.

According to an embodiment, a quantum computing system includes an input processing unit that performs a quantum dot qubit-based quantum computing operation based on a user input algorithm and input data including information for controlling an operation, and converts the user input algorithm into a gate-based transformation algorithm, an algorithm decomposition unit that generates an equivalent circuit corresponding to the transformation algorithm, a quantum circuit mapping unit that generates a modified equivalent circuit by rearranging qubits constituting the equivalent circuit, a driving signal generation unit that generates a driving signal for controlling the modified equivalent circuit, a computing execution unit that performs the quantum computing operation by applying the driving signal to the modified equivalent circuit and generates computing data, and an output unit that converts the computing data into logical data and outputs the logical data as result data.

According to an embodiment, an operating method of a quantum computing system performing a quantum dot qubit-based quantum computing operation based on a user input algorithm and input data including information for controlling an operation includes converting the user input algorithm into a gate-based transformation algorithm, generating an equivalent circuit corresponding to the transformation algorithm, generating a modified equivalent circuit by rearranging qubits constituting the equivalent circuit, generating a driving signal for controlling the modified equivalent circuit, performing the quantum computing operation by applying the driving signal to the modified equivalent circuit and generating computing data, and converting the computing data into logical data and outputting the logical data as result data.

BRIEF DESCRIPTION OF THE FIGURES

The above and other objects and features of the present disclosure will become apparent by describing in detail embodiments thereof with reference to the accompanying drawings.

FIG. 1 is a block diagram illustrating a quantum computing system, according to an embodiment of the present disclosure.

FIG. 2 shows an example of an operation of the algorithm decomposition unit of FIG. 1.

FIG. 4 shows an example of an operation of the driving signal generation unit of FIG. 1.

DETAILED DESCRIPTION

Figure 3:
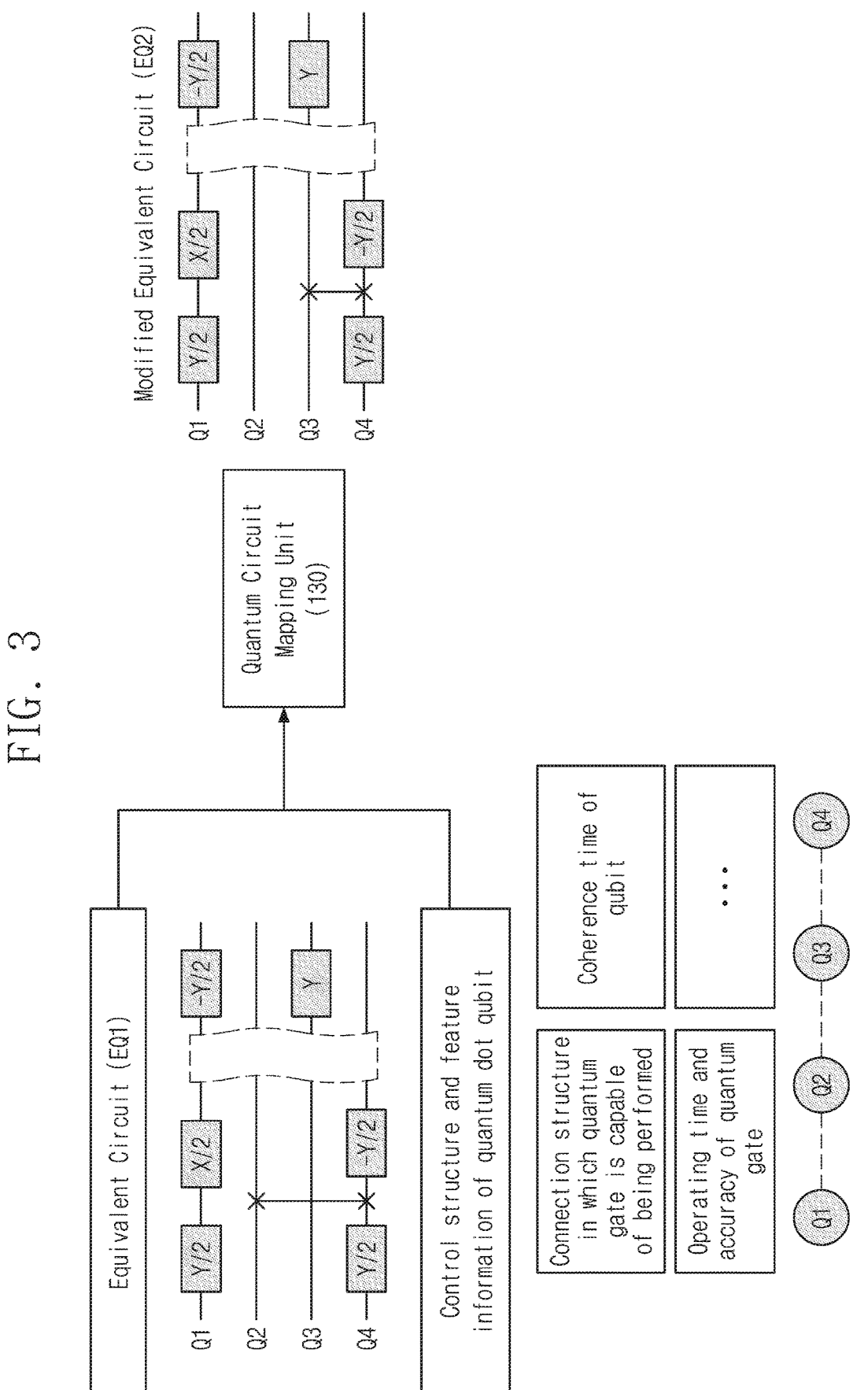
FIG. 3 shows an example of an operation of the quantum circuit mapping unit of FIG. 1.

Hereinafter, embodiments of the present disclosure will be described in detail and clearly to such an extent that an ordinary one in the art easily implements the present disclosure.

Components that are described in the detailed description with reference to the terms "unit", "module", "block", "~er or~or", etc. and function blocks illustrated in drawings will be implemented with software, hardware, or a combination thereof. For example, the software may be a machine code, firmware, an embedded code, and application software. For example, the hardware may include an electrical circuit, an electronic circuit, a processor, a computer, an integrated circuit, integrated circuit cores, a pressure sensor, an inertial sensor, a microelectromechanical system (MEMS), a passive element, or a combination thereof.

Figure 1:
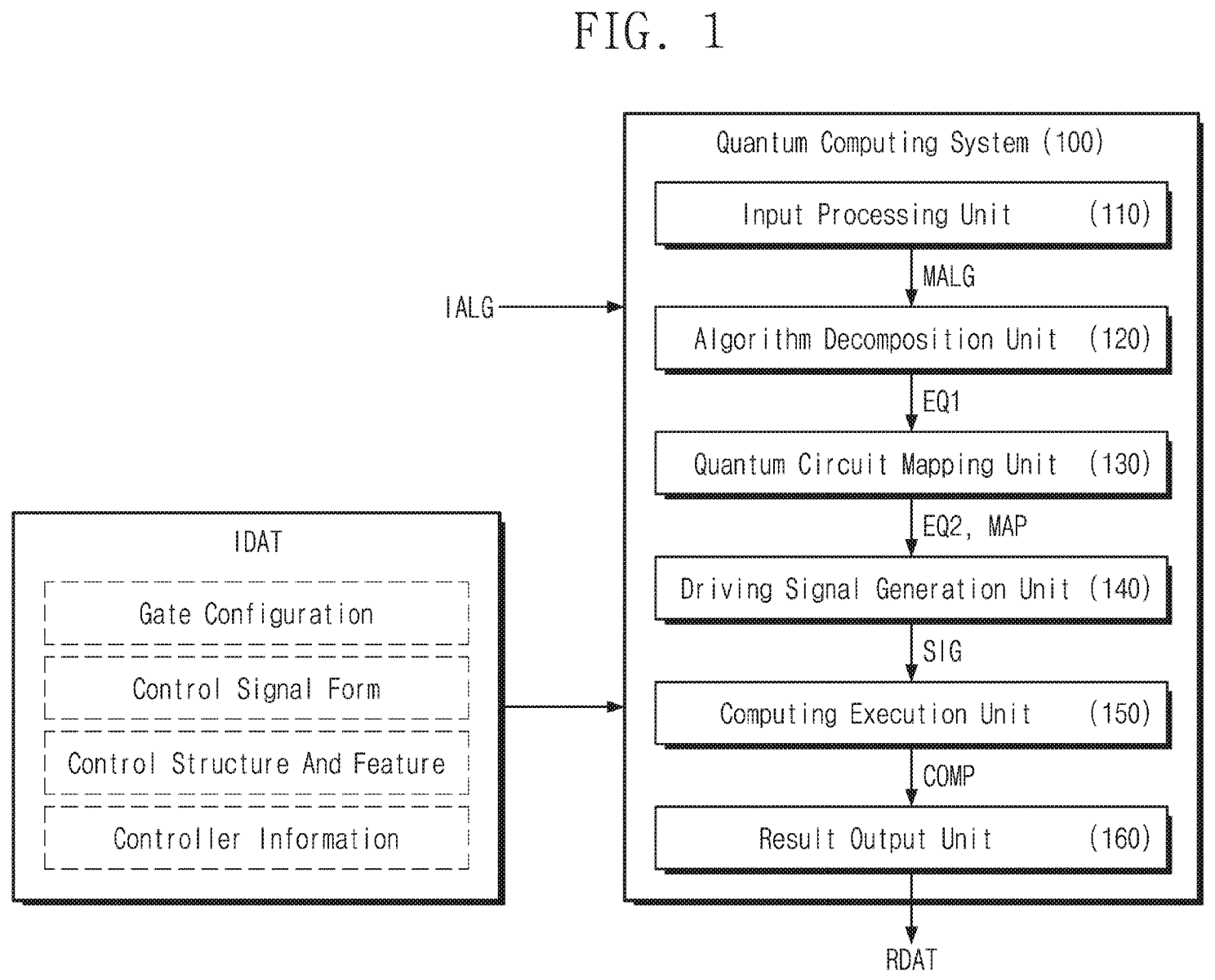

FIG. 1 is a block diagram illustrating a quantum computing system 100, according to an embodiment of the present disclosure. The quantum computing system 100 may perform automated quantum computing by collectively controlling a series of operations from processing inputs to outputting results. In particular, the quantum computing system 100 according to an embodiment of the present disclosure may operate based on quantum dot qubits. For example, the quantum computing system 100 may be implemented (e.g., implemented on the computing device 1000 of FIG. 5) on a general-purpose computer or a special-purpose computer for quantum computing operations.

The quantum computing system 100 may receive a user input algorithm IALG, which is a target of quantum computing, and input data IDAT including quantum chip information for operating quantum computing from the outside (e.g., a user). For example, the user input algorithm IALG may be one of a quantum assembly (QASM), a module such as a quantum Fourier transform, and an execution circuit having a graphic form, but the present disclosure is not limited thereto. For example, the input data IDAT may include a gate configuration of a quantum dot qubit indicating a quantum gate to be driven, a control structure and feature of a quantum dot qubit indicating whether it is possible to operate according to the structure of a quantum gate, a control signal form of a quantum dot qubit for adjusting the precision or quickness of a control signal, and controller information indicating a device to which the control signal is to be applied.

In detail, the quantum computing system 100 may perform quantum computing based on the user input algorithm IALG and the input data IDAT. At this time, the quantum computing system 100 may modify (reconstruct) the user input algorithm IALG by reflecting the feature (e.g., the type of an operation performed between adjacent qubits, a configuration of a gate signal, and the like) of a quantum dot qubit. After the quantum computing is completed, the quantum computing system 100 may output result data RDAT and may deliver the result data RDAT to the outside (e.g., a user). To perform the above-described operations, the quantum computing system 100 may include an input processing unit 110, an algorithm decomposition unit 120, a quantum circuit mapping unit 130, a driving signal generation unit 140, a computing execution unit 150, and a result output unit 160.

The input processing unit 110 may output a transformation algorithm MALG by reconstructing the received user input algorithm IALG such that the received user input algorithm IALG is easily used for quantum dot qubit-based quantum computing. Because the quantum algorithm is capable of being programmed differently depending on usage or configurations, the quantum computing system 100 may receive various types of the user input algorithms IALG for general usage.

The input processing unit 110 may receive an algorithm, which is programmed based on a module-type quantum Fourier transform, a quantum adder, or the like, as the user input algorithm IALG. The algorithm may be programmed in units of Toffoli gates, Controlled-Z gates, and S gates, based on gate-type QASM. Alternatively, the input processing unit 110 may receive a quantum circuit in graphic form as the user input algorithm IALG.

The input processing unit 110 may convert the received user input algorithm IALG in a predetermined method and may output the converted algorithm as the transformation algorithm MALG. For example, the input processing unit 110 may convert the user input algorithm IALG into a gate-based algorithm and may output the gate-based algorithm as the transformation algorithm MALG. Accordingly, the input of the quantum computing system 100 may be standardized, and a calculation error may be reduced.

Hereinafter, for clear descriptions, it is assumed that the transformation algorithm MALG is a gate-based algorithm. However, the present disclosure is not limited thereto. For example, the input processing unit 110 may convert the user input algorithm IALG into an algorithm other than the gate-based algorithm.

The algorithm decomposition unit 120 may generate an equivalent circuit EQ1 capable of performing a quantum dot qubit-based operation, based on the gate-based transformation algorithm MALG and gate configuration information included in the input data IDAT. It is impossible to perform the quantum dot qubit-based operation immediately with only the gate (e.g., a Toffoli gate, a XX gate, or the like) constituting the transformation algorithm MALG. Accordingly, there is a need for an equivalent circuit that is capable of performing the same operation as a gate constituting the transformation algorithm MALG and is also capable of performing a quantum dot qubit-based operation.

To this end, the gate configuration information may include information about gates for constituting a universal gate capable of equivalently expressing all algorithms. For example, the gates for constituting the universal gate may include a 1-qubit gate (e.g., an X gate, a Y gate, an $R_x$ gate, an $R_y$ gate, an $R_z$ gate, an S gate, a T gate, or the like) and a multi-qubit gate (e.g., a CNOT gate, a SWAP gate, a Toffoli gate, a C-Phase gate, a Controlled-Z gate, or the like). Furthermore, the gate configuration information may include information about gates, each of which is capable of performing a quantum dot qubit-based operation.

The algorithm decomposition unit 120 may calculate algorithm information obtained by reflecting a quantum dot qubit feature based on the above-mentioned gate configuration information and the received gate-based transformation algorithm MALG and may generate the equivalent circuit EQ1 capable of performing a quantum dot qubit-based operation. That is, the equivalent circuit EQ1 may be a circuit in which gates constituting the transformation algorithm MALG are decomposed.

For example, the algorithm decomposition unit 120 may decompose a 1-qubit gate into a plurality of 1-qubit gates (e.g., decomposing an S gate into an $R_x$ gate and an $R_y$ gate), and may decompose a multi-qubit gate into a 1-qubit gate or a 2-qubit gate (e.g., decomposing a CNOT gate and a Toffoli gate into a SWAP gate and a C-phase gate). However, the present disclosure is not limited thereto. For example, the algorithm decomposition unit 120 may decompose a 1-qubit gate or a multi-qubit gate in a method different from the above-described method. An example of a detailed operation of the algorithm decomposition unit 120 will be described in more detail with reference to FIG. 2.

The quantum circuit mapping unit 130 may generate a modified equivalent circuit EQ2 capable of performing an operation rapidly and accurately based on the equivalent circuit EQ1 and control structure and feature information of a quantum dot qubit included in the input data IDAT. In detail, the quantum circuit mapping unit 130 may rearrange a qubit order of the equivalent circuit EQ1 to generate the modified equivalent circuit EQ2. A process of rearranging the order of qubits in a quantum circuit may be referred to as "quantum circuit mapping".

In general, as described above, gates constituting the equivalent circuit EQ1, in which gates are decomposed completely, may be 1-qubit gates, 2-qubit gates, or multi-qubit gates. The 1-qubit gate may perform a quantum dot qubit-based operation regardless of a driving condition. However, a 2-qubit gate or a multi-qubit gate using a larger number of qubits may fail to perform a quantum dot qubit-based operation immediately under the driving condition.

Accordingly, in some cases, the arrangement of qubit gates constituting the equivalent circuit EQ1 may be changed to perform a quantum dot qubit-based operation accurately. As such, to change the arrangement of qubit gates, an exchange gate may be added to a quantum circuit. However, because the efficiency of an operation may decrease as the exchange gate is added, an exchange gate needs to be minimally added for an accurate and fast operation.

Accordingly, under a gate operating condition that a quantum dot qubit-based operation is capable of being performed, the quantum circuit mapping unit 130 may match the order of qubits positioned in the equivalent circuit EQ1 to the order of qubits to be actually driven. Moreover, in this process, the quantum circuit mapping unit 130 may adjust the order of qubits depending on the operating speed and accuracy of qubits (i.e., perform quantum circuit mapping), and may determine a qubit that will perform an operation.

For example, control structure and feature information of a quantum dot qubit included in the input data IDAT may include a connection structure (e.g., a 2-qubit gate is capable of operating between only adjacent qubits) in which an operation is possible, a coherence time of a quantum dot qubit, an operating time and accuracy of a quantum gate, or the like. Here, the operating time of a quantum gate and the coherence time of a quantum dot qubit may be used to evaluate an operation execution time of the quantum computing system 100.

The qubit order of the equivalent circuit EQ1 may be rearranged such that operations are performed rapidly and accurately and the number of additional exchange gates is capable of being minimized through the above-described operation of the quantum circuit mapping unit 130. Accordingly, the modified equivalent circuit EQ2 in which gate decomposition and quantum circuit mapping are completed may be generated. Furthermore, together with the modified equivalent circuit EQ2, the quantum circuit mapping unit 130 may output mapping information MAP indicating how the qubit order has been rearranged. An example of a detailed operation of the quantum circuit mapping unit 130 is described in detail with reference to FIG. 3.

The driving signal generation unit 140 may generate a driving signal SIG for controlling a quantum circuit based on the modified equivalent circuit EQ2 and control signal form information included in the input data IDAT. To drive a quantum gate for a quantum dot qubit-based operation, the state adjustment of a quantum dot or a high-frequency signal input may be required.

To this end, the driving signal SIG may be a quantum gate signal capable of being input to each quantum dot of the modified equivalent circuit EQ2. For example, the driving signal SIG may be used to adjust a state of a quantum dot, to input a high-frequency signal, to determine whether to repeat an operation of canceling an error, to generate a complex control signal for canceling an error, or to search for a point for attenuating external noise.

For example, the control signal type information included in the input data IDAT may include information about a preparation time required to perform a 2-qubit gate, a voltage difference, a configuration of an envelope for inputting a high-frequency signal, a configuration of a complex control signal, whether to separately input a point for attenuating external noise, or the like.

Because the modified equivalent circuit EQ2 generated by the quantum circuit mapping unit 130 is a circuit in which gate decomposition and quantum circuit mapping are completed, a quantum dot qubit-based operation may be performed immediately. However, when the appropriate driving signal SIG is applied depending on the gate driving order of each qubit through the above-described operation of the driving signal generation unit 140, the speed and accuracy of an operation may be improved. An example of a detailed operation of the driving signal generation unit 140 will be described in detail with reference to FIG. 4.

The computing execution unit 150 may generate a computing data COMP based on controller information (e.g., information about a quantum dot qubit controller) included in the input data IDAT and the driving signal SIG. That is, the computing execution unit 150 may generate the computing data COMP by performing a quantum dot qubit-based operation on a quantum algorithm (finally converted into a form of the modified equivalent circuit EQ2 through the above-described operation) received from a user. To this end, the computing execution unit 150 may apply the driving signal SIG to quantum dot qubits of the modified equivalent circuit EQ2.

In detail, to apply the driving signal SIG to the quantum dot qubits, the computing execution unit 150 may provide the modified equivalent circuit EQ2 and information related to the driving signal SIG to a quantum dot qubit controller (not shown) that forms a quantum dot and applies a quantum gate. For example, the quantum dot qubit controller may be implemented by using hardware, software, or a combination thereof. The quantum dot qubit controller may deliver the corresponding driving signal SIG to each qubit based on the provided information. Accordingly, a method of controlling each qubit, which is theoretically calculated by the driving signal generation unit 140, may be applied to a qubit thus substantially corresponding thereto.

Besides, the computing execution unit 150 needs to consider controller information indicating a feature of the quantum dot qubit controller. For example, the controller information may include a method of providing the modified equivalent circuit EQ2 and information related to the driving signal SIG to the quantum dot qubit controller, a required input voltage, or the like, but the present disclosure is not limited thereto. Furthermore, when a plurality of quantum dot qubit controllers need to be used, the computing execution unit 150 may also consider a difference in a feature for each controller. For example, when it is necessary to use a plurality of controllers to apply the required input voltage V (i.e., when only one controller fails to apply entire input voltages), the computing execution unit 150 may provide the modified equivalent circuit EQ2 and the information related to the driving signal SIG to each controller in consideration of the feature difference between two controllers and may generate the computing data COMP.

The result output unit 160 may convert the computing data COMP generated by the computing execution unit 150 into logical data (i.e., represented as '0' and '1') and may output the logical data as the result data RDAT. A result that a user wants to receive may vary depending on the type of the used quantum algorithm, the user's expertise, or the purpose of an operation.

That is, the result output unit 160 may convert the quantum computing result, which is calculated by performing a quantum algorithm based on quantum dot qubits, into logical data desired by the user depending on the number of quantum dot qubits and may output the logical data as the result data RDAT. To this end, the result output unit 160 may receive predefined logical signal information. For example, the predefined logical signal information may be included in the input data IDAT. For example, the logical signal information may include information indicating that a physical signal of 0 V may correspond to a logical value of '0', information indicating that an event that a resonant peak is visible corresponds to a logic value of '0', or the like.

For example, together with the converted logical data, the result data RDAT may include whether the converted result is the same as or different from a result of a quantum algorithm operation, the speed of a quantum computing operation, whether the result of the quantum computing operation is within a sufficient error range, or whether a quantum state is similar to a theoretical computation result. Various pieces of information included in the result data RDAT may be selectively output depending on the user's selection.

Figure 2:
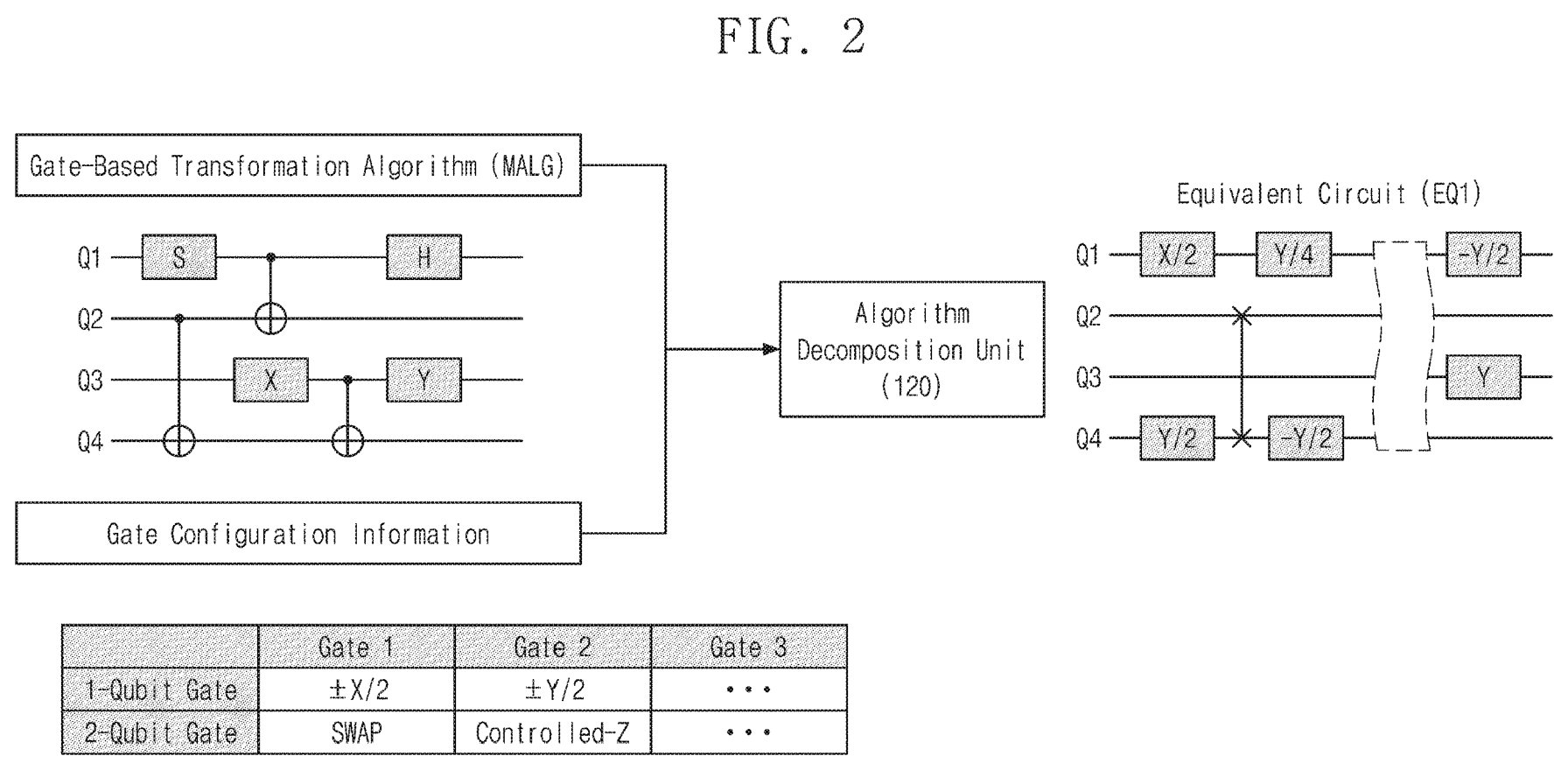

FIG. 2 shows an example of an operation of the algorithm decomposition unit 120 of FIG. 1. As described with reference to FIG. 1, the algorithm decomposition unit 120 may generate the equivalent circuit EQ1 corresponding to the received gate-based transformation algorithm MALG. Q1 to Q4 indicate quantum dots qubits, respectively. As such, an operation of generating an equivalent circuit corresponding to a quantum algorithm may be referred to as "algorithm decomposition", "quantum circuit decomposition", or "gate decomposition".

For example, when a gate rotating about an n-axis bye is $R_n(e)$, the algorithm decomposition unit 120 may decompose an "RAO)" gate into an equivalent $R_x(\pi/2)R_y(\theta)R_x(-\pi/2)$ gate. Referring to FIG. 2, an input circuit of the gate-based transformation algorithm MALG may include a 1-qubit gate (e.g., an S gate). For example, assuming that the 1-qubit gate included in the input circuit is an $R_z(\pi/4)$ gate, the algorithm decomposition unit 120 may decompose $R_z(\pi/4)$ into an equivalent $R_x(\pi/2)R_y(\pi/4)R_x(-\pi/2)$ gate (i.e., decomposing a 1-qubit gate into a plurality of 1-qubit gates). However, the present disclosure is not limited thereto. For example, the algorithm decomposition unit 120 may decompose a qubit gate in various methods different from the above-described method and may generate an equivalent circuit.

FIG. 3 shows an example of an operation of the quantum circuit mapping unit 130 of FIG. 1. As described with reference to FIG. 1, the quantum circuit mapping unit 130 may generate the modified equivalent circuit EQ2 by rearranging quantum dot qubits of the equivalent circuit EQ1 (i.e., performing quantum circuit mapping). Q1 to Q4 indicate quantum dots qubits, respectively.

For example, when a 2-qubit gate is capable of performing an operation between only qubits adjacent to each other, an operation between Q1 and Q2, an operation between Q2 and Q3, and an operation between Q3 and Q4 may be performed, but an operation between Q1 and Q4 may not be directly performed. Accordingly, in the equivalent circuit EQ1, an exchange gate (shown as a solid line between Q2 and Q4 in the equivalent circuit EQ1) between Q2 and Q4 may not be used directly. A process of applying an exchange gate to a location between Q3 and Q2, exchanging Q3 and Q4, and again exchanging Q3 and Q2 needs to be performed. However, in this case, the exchange gate needs to be added twice.

On the other hand, because an exchange gate (shown as a solid line between Q3 and Q4 in the modified equivalent circuit EQ2) between Q3 and Q4 may be used directly when the modified equivalent circuit EQ2 is generated after locations of Q2 and Q3 are exchanged with each other through an operation of the quantum circuit mapping unit 130, fewer exchange gates may be included. Accordingly, the efficiency, accuracy, and speed of an operation may be improved.

As described above, the quantum circuit mapping unit 130 may perform quantum circuit mapping in consideration of the operating time and accuracy of a quantum gate and a coherence time of a qubit, which are included in control structure and feature information of a quantum dot qubit. For example, when Q1 and Q2 have the same accuracy but an operation execution time of Q1 is faster than an operation execution time of Q2, a quantum circuit may be rearranged such that the corresponding operation is capable of being performed by using Q1. Alternatively, when Q1 and Q2 have the same operation execution time but an accuracy of Q1 is higher than an accuracy of Q2, a quantum circuit may be rearranged such that the corresponding operation is capable of being performed by using Q1. For example, the quantum circuit mapping unit 130 may use a cost function to determine such the accuracy and time.

FIG. 4 shows an example of an operation of the driving signal generation unit 140 of FIG. 1. As described with reference to FIG. 1, the driving signal generation unit 140 may generate the driving signal SIG, which is a quantum gate signal capable of being input to each quantum dot of the modified equivalent circuit EQ2. The driving signal generation unit 140 may determine how to control a quantum gate, by generating the driving signal SIG and may perform fast and accurate operations.

For example, to reduce the operating time of the quantum gate, the driving signal generation unit 140 may generate the driving signal SIG for controlling both an N-th gate and an (N+1)-th gate of Q1. Alternatively, the driving signal generation unit 140 may utilize a dynamic decoupling method for performing an accurate operation in the quantum gate. For example, operations are arranged, for example, "B, −B, A, B, −B", by adding operation B and operation −B before and after operation A, and the driving signal SIG for controlling the operations are applied, thereby improving the accuracy of an operation performed in the quantum gate. Furthermore, to minimize an external influence of a quantum dot, the driving signal generation unit 140 may generate the driving signal SIG for selecting or searching for a point with few errors according to a spin or a charge and performing a quantum operation at the location. That is, the driving signal SIG may be used to generate a complex control signal for canceling an error, to determine whether to repeat an operation of canceling an error, or to search for a point for attenuating external noise.

Figure 5:
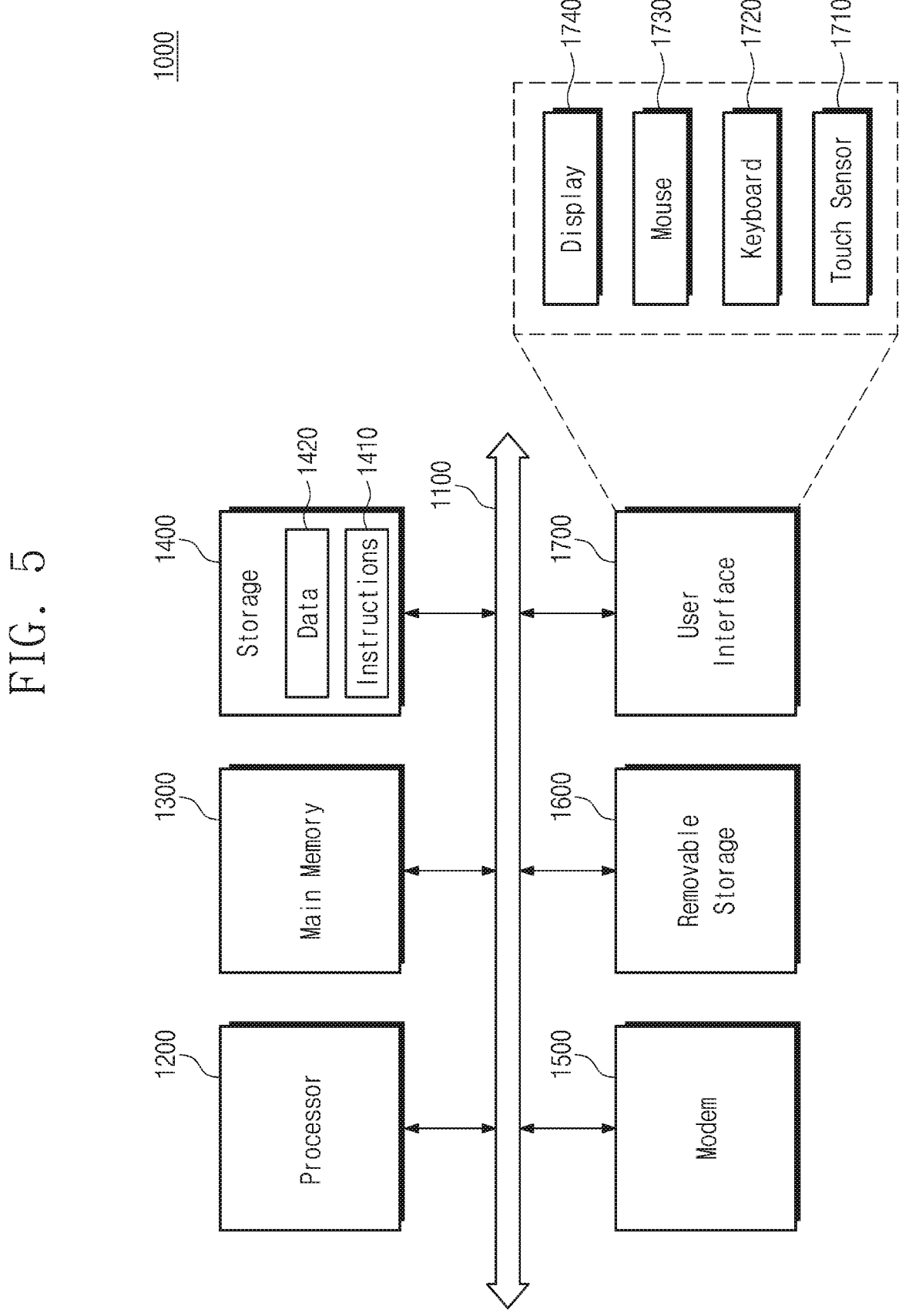
FIG. 5 is a block diagram illustrating a computing device capable of being implemented by the quantum computing system of FIG. 1.

FIG. 5 is a block diagram illustrating a computing device 1000 capable of being implemented by the quantum computing system 100 of FIG. 1. Referring to FIG. 5, the computing device 1000 may include a bus 1100, a processor 1200, a main memory 1300, storage 1400, a modem 1500, removable storage 1600, and a user interface 1700. The bus 1100 may provide a channel between the components of the computing device 1000.

The processor 1200 may control the computing device 1000 and may perform a quantum dot qubit-based operation by implementing the quantum computing system 100. For example, the processor 1200 may execute a tool for a quantum computing operation by executing instructions 1410 stored in the storage 1400. The processor 1200 may implement or execute a quantum computing system by reading and reflecting data stored in the storage 1400 to the tool.

The main memory 1300 may be a working memory of the processor 1200. The main memory 1300 may temporarily store instructions or data, which the processor 1200 requires, from among the instructions 1410 and data 1420 stored in the storage 1400. The main memory 1300 may include a high-speed random access memory, such as a DRAM, a PRAM, an MRAM, or an RRAM, or a storage class memory (SCM).

The storage 1400 may be used as a secondary memory of the computing device 1000. The storage 1400 may store the instructions 1410 constituting a tool for a quantum computing operation, and the data 1420 for a quantum computing system. The storage 1400 may include a hard disk drive (HDD), a solid state drive (SSD), an optical disk drive (ODD), etc.

The modem 1500 may communicate with an external device in a wired or wireless manner. For example, the instructions 1410 or the data 1420 may be stored in the storage 1400 through the modem 1500 from an external device. The instructions 1410 or the data 1420 stored in the storage 1400 may be delivered to the external device through the modem 1500. The modem 1500 may be based on Ethernet.

The removable storage 1600 may include portable storage. For example, the instructions 1410 or the data 1420 may be moved from the removable storage 1600 to the storage 1400. The instructions 1410 or the data 1420 stored in the storage 1400 may be moved to the removable storage 1600. The removable storage 1600 may be based on one of various standards such as a universal serial bus (USB) and serial advanced technology attachment (SATA).

The user interface 1700 may include various user input interface devices such as a touch sensor 1710, a keyboard 1720, and a mouse 1730. The user interface 1700 may receive the input data IDAT for performing a quantum computing operation and the user input algorithm IALG from a user.

The user interface 1700 may include various user output interface devices such as a display 1740. The user interface 1700 may deliver, to the user, the tool for the quantum computing operation, the quantum computing system, and the process and result of the quantum computing operation.

For example, the computing device 1000 may be implemented with a general-use computer or a special-purpose computer for the quantum computing operation. The tool for the quantum computing operation may be delivered in a form of the instructions 1410 through the modem 1500 or the removable storage 1600. The data 1420 for the quantum computing operation may be delivered through the modem 1500 or the removable storage 1600.

Figure 6:
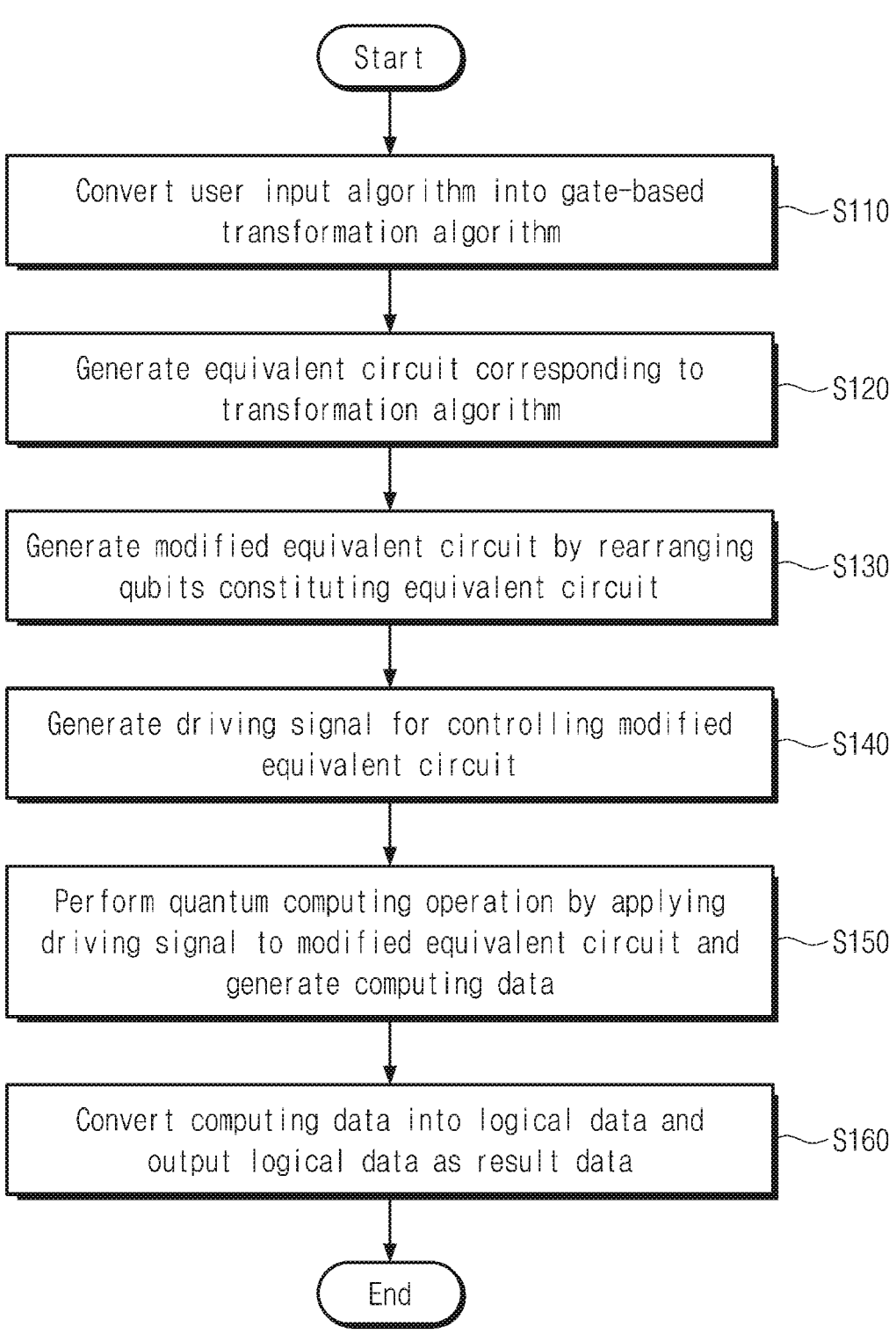
FIG. 6 is a flowchart illustrating an operating method of a quantum computing system, according to an embodiment of the present disclosure.

FIG. 6 is a flowchart illustrating an operating method of a quantum computing system, according to an embodiment of the present disclosure. Hereinafter, a method will be described with reference to FIG. 1 together with FIG. 6.

In operation S110, the input processing unit 110 may convert the user input algorithm IALG into the gate-based transformation algorithm MALG. For example, the user input algorithm IALG may be programmed in units of gates based on QASM. In operation S120, the algorithm decomposition unit 120 may generate the equivalent circuit EQ1 corresponding to the transformation algorithm MALG. For example, the algorithm decomposition unit 120 may perform a gate decomposition operation on the transformation algorithm MALG based on gate driving information included in the input data IDAT.

In operation S130, the quantum circuit mapping unit 130 may generate the modified equivalent circuit EQ2 by rearranging qubits constituting the equivalent circuit EQ1. For example, the quantum circuit mapping unit 130 may perform quantum circuit mapping on the equivalent circuit EQ1 based on control structure and feature information included in the input data IDAT. In operation S140, the driving signal generation unit 140 may generate the various driving signals SIG for controlling the modified equivalent circuit EQ2.

In operation S150, the computing execution unit 150 may perform a quantum computing operation by applying the driving signal SIG to the modified equivalent circuit EQ2 and may generate the computing data COMP. In operation S160, the result output unit 160 may convert the computing data COMP into logical data and may output the logical data as the result data RDAT.

The above description refers to embodiments for implementing the present disclosure. Embodiments in which a design is changed simply or which are easily changed may be included in the present disclosure as well as an embodiment described above. In addition, technologies that are easily changed and implemented by using the above embodiments may be included in the present disclosure. While the present disclosure has been described with reference to embodiments thereof, it will be apparent to those of ordinary skill in the art that various changes and modifications may be made thereto without departing from the spirit and scope of the present disclosure as set forth in the following claims.

According to an embodiment of the present disclosure, the complexity of quantum computing may be reduced, the required time of quantum computing may be shortened, and the accuracy of quantum computing may be improved.

While the present disclosure has been described with reference to embodiments thereof, it will be apparent to those of ordinary skill in the art that various changes and modifications may be made thereto without departing from the spirit and scope of the present disclosure as set forth in the following claims.

What is claimed is:

1. A quantum computing system performing a quantum dot qubit-based quantum computing operation based on a user input algorithm and input data including information for controlling an operation, the system comprising:

an input processing unit configured to convert the user input algorithm into a gate-based transformation algorithm;

an algorithm decomposition unit configured to generate an equivalent circuit corresponding to the transformation algorithm;

a quantum circuit mapping unit configured to generate a modified equivalent circuit by rearranging qubits constituting the equivalent circuit;

a driving signal generation unit configured to generate a driving signal for controlling the modified equivalent circuit;

a computing execution unit configured to perform the quantum computing operation by applying the driving signal to the modified equivalent circuit and to generate computing data; and an output unit configured to convert the computing data into logical data and to output the logical data as result data, wherein the quantum circuit mapping unit generates the modified equivalent circuit based on control structure and feature information included in the input data, and wherein the control structure and feature information includes a connection structure of a quantum gate in which an operation is possible, a coherence time of a quantum dot qubit, and an operating time and accuracy of a quantum gate.

2. The system of claim 1, wherein the user input algorithm is programmed in units of gate based on quantum assembly (QASM).

3. The system of claim 1, wherein the algorithm decomposition unit generates the equivalent circuit based on gate configuration information included in the input data, and wherein the gate configuration information includes information about gates corresponding to the user input algorithm and information about gates, each of which is capable of performing a quantum dot qubit-based operation.

4. The system of claim 3, wherein the transformation algorithm includes a 1-qubit gate or a multi-qubit gate as an input circuit, and wherein the algorithm decomposition unit decomposes the 1-qubit gate included in the input circuit into a plurality of 1-qubit gates, and decomposes the multi-qubit gate included in the input circuit into a 1-qubit gate or a 2-qubit gate.

5. The system of claim 4, wherein the 1-qubit gate includes a S gate, a T gate, an $R_x$ gate, an $R_y$ gate, and an $R_z$ gate, and the multi-qubit gate includes a CNOT gate, a SWAP gate, a Toffoli gate, a C-Phase gate, and a Controlled-Z gate.

6. The system of claim 1, wherein the quantum circuit mapping unit rearranges the qubits depending on an operating speed and accuracy of each of the qubits.

7. The system of claim 1, wherein the driving signal is a quantum gate signal capable of being applied to each quantum dot of the modified equivalent circuit.

8. The system of claim 7, wherein the driving signal is used to cancel an error related to an operation of the modified equivalent circuit by simultaneously controlling a plurality of gates included in a qubit of the modified equivalent circuit and to attenuate external noise by searching for a point having few errors according to a spin and a charge in the modified equivalent circuit.

9. The system of claim 1, wherein the computing execution unit provides a quantum dot qubit controller, which applies a quantum gate to the system, with the modified equivalent circuit and information related to the driving signal such that the driving signal is applied to the modified equivalent circuit.

10. The system of claim 1, wherein the output unit converts the computing data into the logical data based on predefined logical signal information, and wherein the result data further includes an accuracy of the quantum computing operation, a speed of the quantum computing operation, and whether a result of the quantum computing operation is within an error range.

11. An operating method of a quantum computing system performing a quantum dot qubit-based quantum computing operation based on a user input algorithm and input data including information for controlling an operation, the method comprising:

converting the user input algorithm into a gate-based transformation algorithm;

generating an equivalent circuit corresponding to the transformation algorithm;

generating a modified equivalent circuit by rearranging qubits constituting the equivalent circuit;

generating a driving signal for controlling the modified equivalent circuit;

performing the quantum computing operation by applying the driving signal to the modified equivalent circuit and generating computing data; and converting the computing data into logical data and outputting the logical data as result data, wherein the generating of the modified equivalent circuit includes:

generating the modified equivalent circuit based on control structure and feature information included in the input data, and wherein the control structure and feature information includes a connection structure of a quantum gate in which an operation is possible, a coherence time of a quantum dot qubit, and an operating time and accuracy of a quantum gate.

12. The method of claim 11, wherein the generating of the equivalent circuit includes:

generating the equivalent circuit based on gate configuration information included in the input data, and wherein the gate configuration information includes information about gates corresponding to the user input algorithm and information about gates, each of which is capable of performing a quantum dot qubit-based operation.

13. The method of claim 11, wherein the generating of the modified equivalent circuit based on the control structure and feature information includes:

rearranging the qubits depending on an operating speed and accuracy of each of the qubits.

14. The method of claim 11, wherein the driving signal is a quantum gate signal capable of being applied to each quantum dot of the modified equivalent circuit, further comprising:

canceling an error related to an operation of the modified equivalent circuit by simultaneously controlling a plurality of gates included in a qubit of the modified equivalent circuit; and attenuating external noise by searching for a point having few errors according to a spin and a charge in the modified equivalent circuit.

15. The method of claim 11, wherein the generating of the computing data includes:

providing a quantum dot qubit controller, which applies a quantum gate to the system, with the modified equivalent circuit and information related to the driving signal such that the driving signal is applied to the modified equivalent circuit.

16. The method of claim 11, wherein the outputting of the logical data as result data includes:

converting the computing data into the logical data based on predefined logical signal information, and wherein the result data further includes an accuracy of the quantum computing operation, a speed of the quantum computing operation, and whether a result of the quantum computing operation is within an error range.

\* \* \* \* \*